United States Patent [19]
Pan et al.

[11] Patent Number: 5,616,052
[45] Date of Patent: Apr. 1, 1997

[54] SCREW MOUNTING KIT FOR USE WITHIN CONNECTOR

[75] Inventors: Hua-Tsung Pan, Taipei; Y. M. Ho, Pan-Chiao, both of Taiwan

[73] Assignee: Hon Hai Precision Ind. Co., Ltd., Taiwan

[21] Appl. No.: 437,967

[22] Filed: May 10, 1995

[51] Int. Cl.⁶ ..................................................... H02B 1/01
[52] U.S. Cl. .......................... 439/573; 439/564; 411/182; 411/508
[58] Field of Search ................... 439/573, 564, 439/567, 569, 570, 64; 411/182, 508, 509

[56] References Cited

U.S. PATENT DOCUMENTS

| | | | |
|---|---|---|---|
| 5,241,451 | 8/1993 | Walburn et al. | 439/567 |
| 5,249,983 | 10/1993 | Hirai | 439/573 |
| 5,419,713 | 5/1995 | Northey | 439/567 |

FOREIGN PATENT DOCUMENTS 0707819  4/1954  United Kingdom ................... 411/182

*Primary Examiner*—Neil Abrams
*Assistant Examiner*—Brian J. Biggi

[57] ABSTRACT

An electrical connector includes an insulative housing (30) adapted to be mounted on a PC board (60). The housing (32) includes a pair of kit receiving holes (34) for receiving a pair of corresponding screw mounting kits (36) therein. Each screw mounting kit (36) includes a head portion (38) at the top with internal threads, a tubular portion (40) in the middle and a truncated tubular conical portion (42) at the bottom wherein a plurality of slots (44) extend axially through the tubular portion (40) and the conical portion (42). Correspondingly, the kit receiving hole (34) in the housing (32) includes a large section (46) at the top, a narrow section (48) in the middle and a medium section (50) at the bottom for receiving the head portion 38, the tubular portion (40) and the conical portion (42) of the kit (36), respectively.

5 Claims, 8 Drawing Sheets

SCREW MOUNTING KIT FOR USE WITHIN CONNECTOR

BACKGROUND OF THE INVENTION

1. Field of The Invention

The invention relates to electrical connectors mounted on the PC board, especially to screw mounting kits for use with connectors wherein such connectors are fastened to the PC board by means of screws latchably extending through such screw mounting kits and the PC board.

2. The Prior Art

As shown in FIG. 1, the conventional memory card connector 10 includes a header device 12 with a pair of attached rearward extending arms 14 by means of a securement plate. A sliding plate 18 incorporates a lever 20 which is actuated by a pushing bar 22, to eject an inserted memory card (not shown) from the interior of the connector 10. The general structure and performance of the memory card connector with ejector means, may be found in some U.S. patents, such as U.S. Pat. No. 5,286,207. As shown in FIGS. 2 and 3, a pair of screw mounting kit or insert 24 are designedly embedded within a pair of corresponding kit receiving holes 26 in the front portion of the header device 12 for therein receiving a pair of screws (not shown) which latchably extends through such screw mounting kit 24 and the corresponding PC board on which the connector 10 is mounted, and locks the connector 10 onto the board.

One disadvantage has been found that such pair of screw mounting kits 24 are generally forcibly retained within the corresponding holes 26 with an interference fit. Therefore, it is required to have high precise dimensions of these counterparts for tolerance control. Additionally, the connector 10 with the screw mounting kits 24 will be in a soldering process for mounting the connector 10 onto the board. Because the metal-made screw mounting kit 24 may have a relatively faster shrinking than the plastic header 12 of the connector 10 during the cooling process after soldering, thus weakening the interference fit between the screw mounting kit 24 and the hole 26. This may result in the screw mounting kit being dropped from the connector header 12 if vibration is applied to the connector 10 at the same time.

Therefore, an object of the invention is to provide an electrical connector, which is mounted on the board, having an improved mounting kit incorporating the kit receiving hole in the connector for securely fastening such kit to the connector.

SUMMARY OF THE INVENTION

According to an aspect of the invention, an electrical connector includes an insulative housing adapted to be mounted on a PC board. The housing includes a pair of kit receiving holes for receiving a pair of corresponding screw mounting kits therein. Each screw mounting kit includes a head portion with internal threads at the top, a tubular portion in the middle and a truncated tubular conical portion at the bottom wherein a plurality of slots extends axially through the tubular portion and the conical portion. Correspondingly, the kit receiving hole in the housing includes a large section at the top, a narrow section in the middle and a medium section at the bottom. Therefore, the screw mounting kits may be assembled to the corresponding holes in the housing from the top whereby the conical portion and the tubular portion of the kit may be inserted into the corresponding medium section and narrow section of the hole in the housing by means of resiliency provided by the axial slots. Eventually such kit is completely properly retained within the corresponding hole because the upper step between the large section and the narrow section in the hole can engage the head portion of the kit for prohibiting the downward movement of the kit in the hole, and the lower step between the narrow section and the medium section in the hole can engage the conical portion of the kit for prohibiting the upward movement of the kit in the hole.

DETAILED DESCRIPTION OF THE PREFERRED EMBODIMENT

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiment by those skilled in the art without departing from the true spirit and scope of the invention as defined by appended claims.

Figure 1:
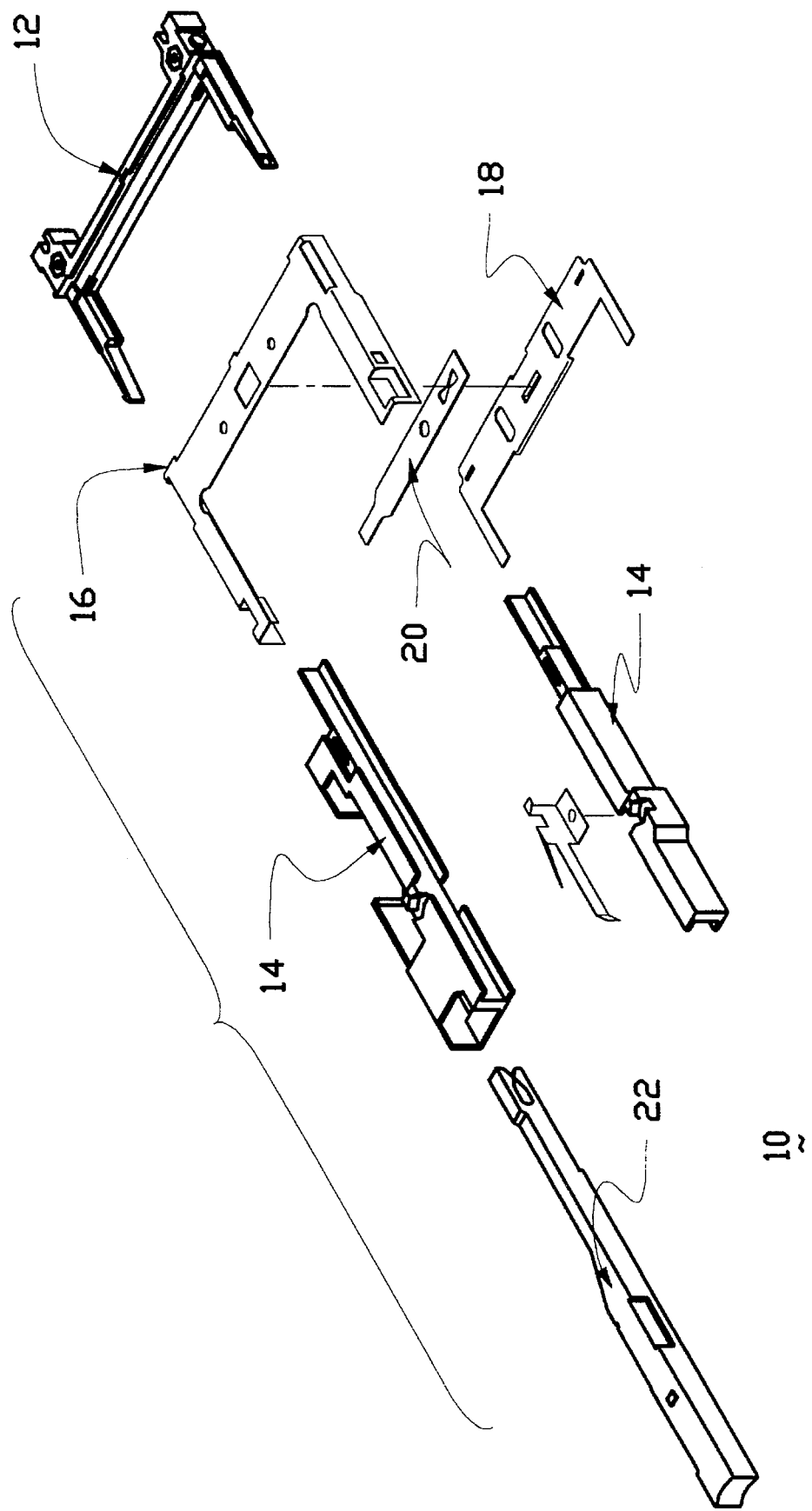
FIG. 1 is an exploded perspective view of a conventional memory card connector.
Figure 2:
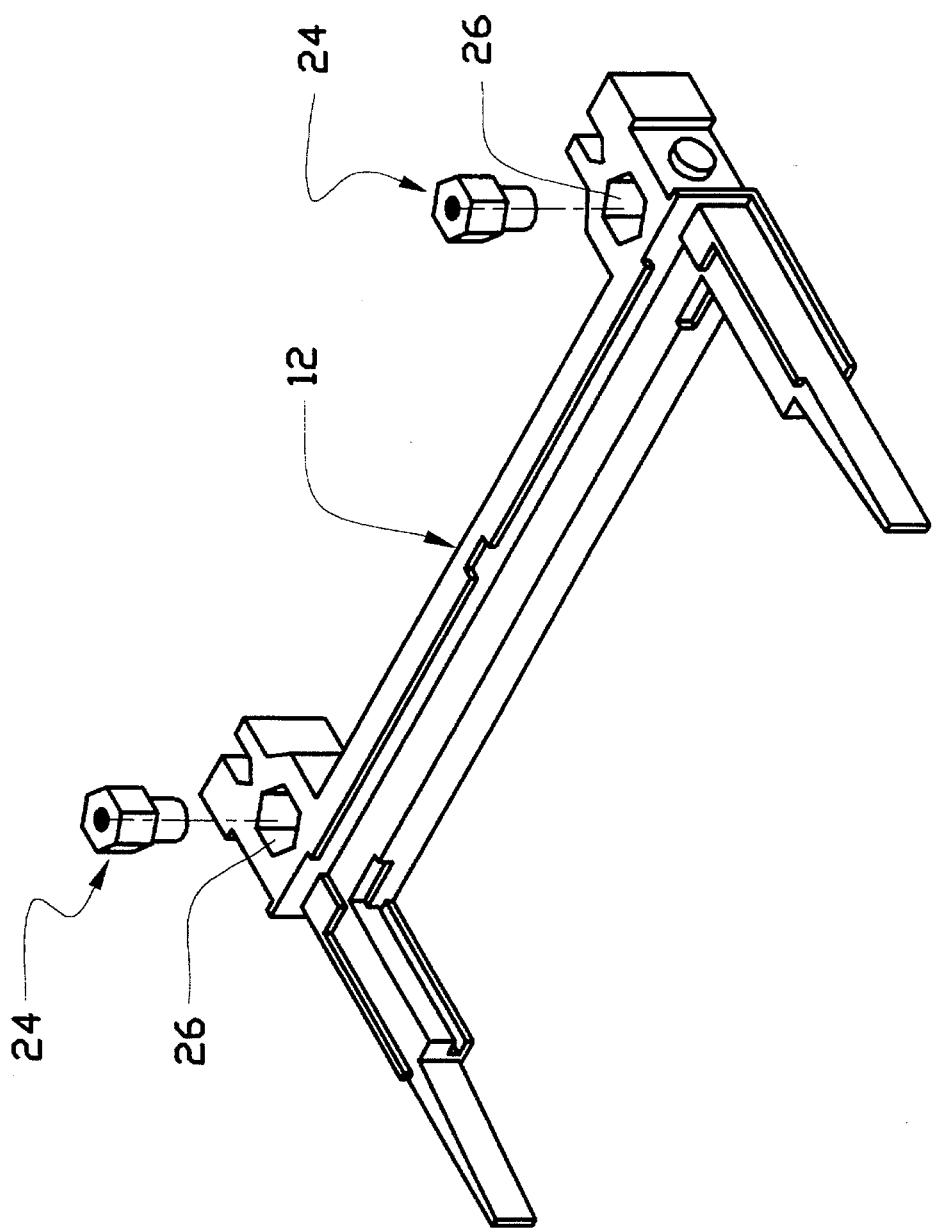
FIG. 2 is an enlarged perspective view of a header device of the connector of FIG. 1 with the screw mounting kits adapted to be received therein.
Figure 3:
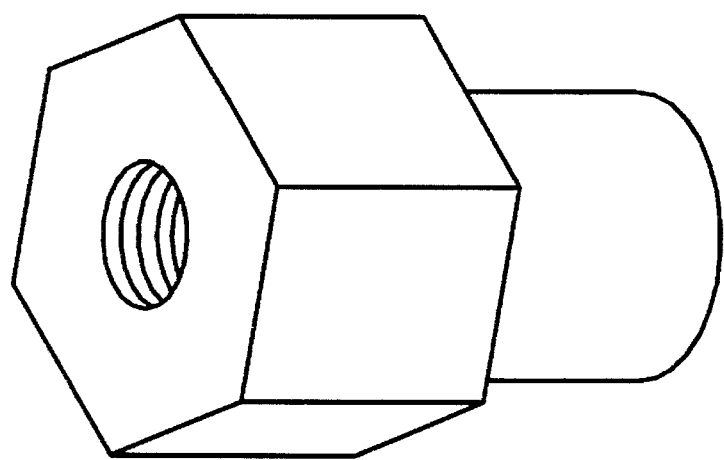
FIG. 3 is an enlarged perspective view of the screw mounting kit of FIG. 1.
Figure 4:
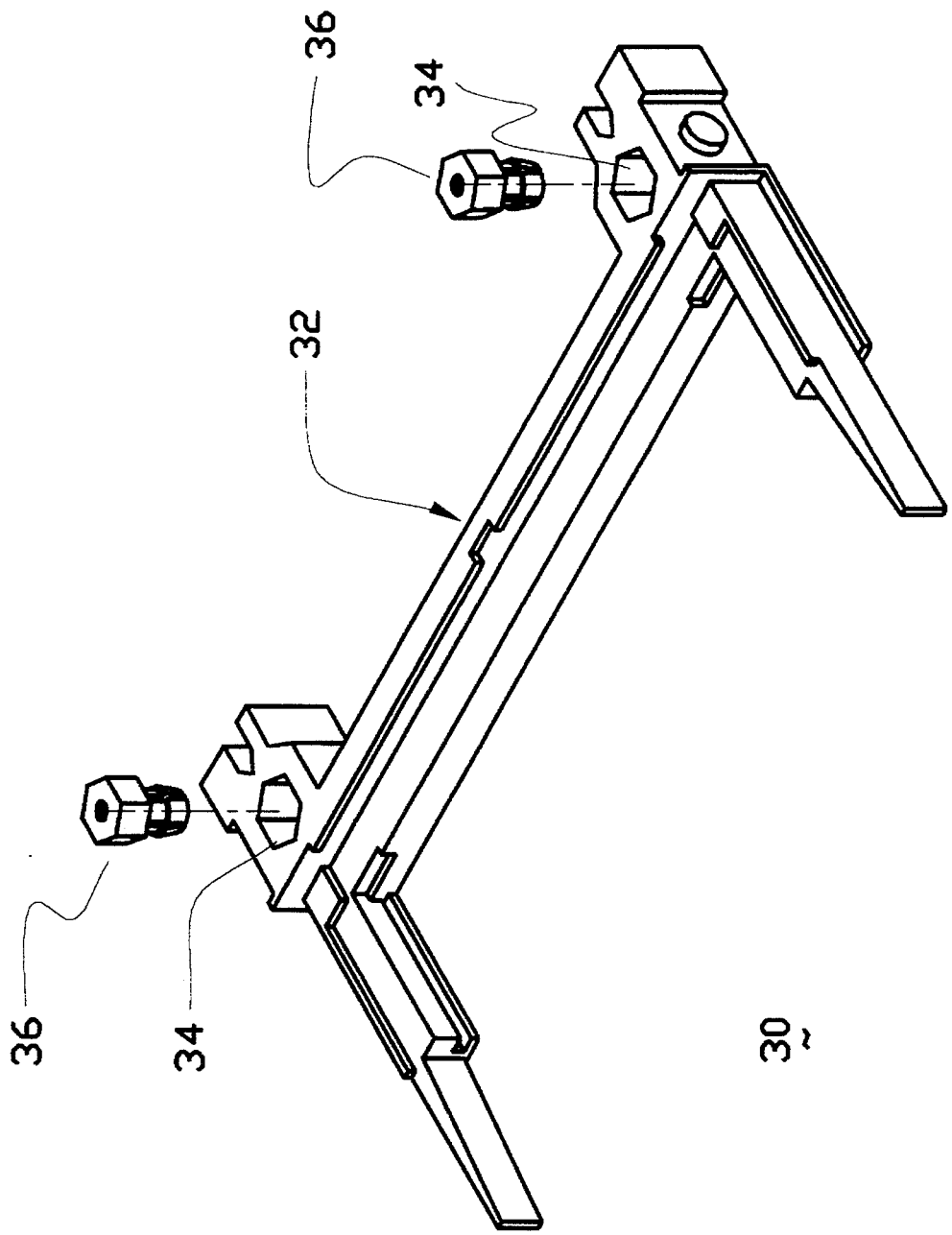
FIG. 4 is an enlarged perspective view of a header device of a memory card connector with the screw mounting kits adapted to be received therein according to the invention.

It will be noted here that for a better understanding, most of like components are designated by like reference numerals throughout the various figures in the embodiment. To simplify the illustration, FIG. 4 only shows a header device 30 of the connector, and the other portions of the connector may be referred to FIG. 1 of the prior art without substantial differences. The header device 30 including an insulative housing 32 wherein a pair of kit receiving holes 34 are positioned therein.

Figure 5:
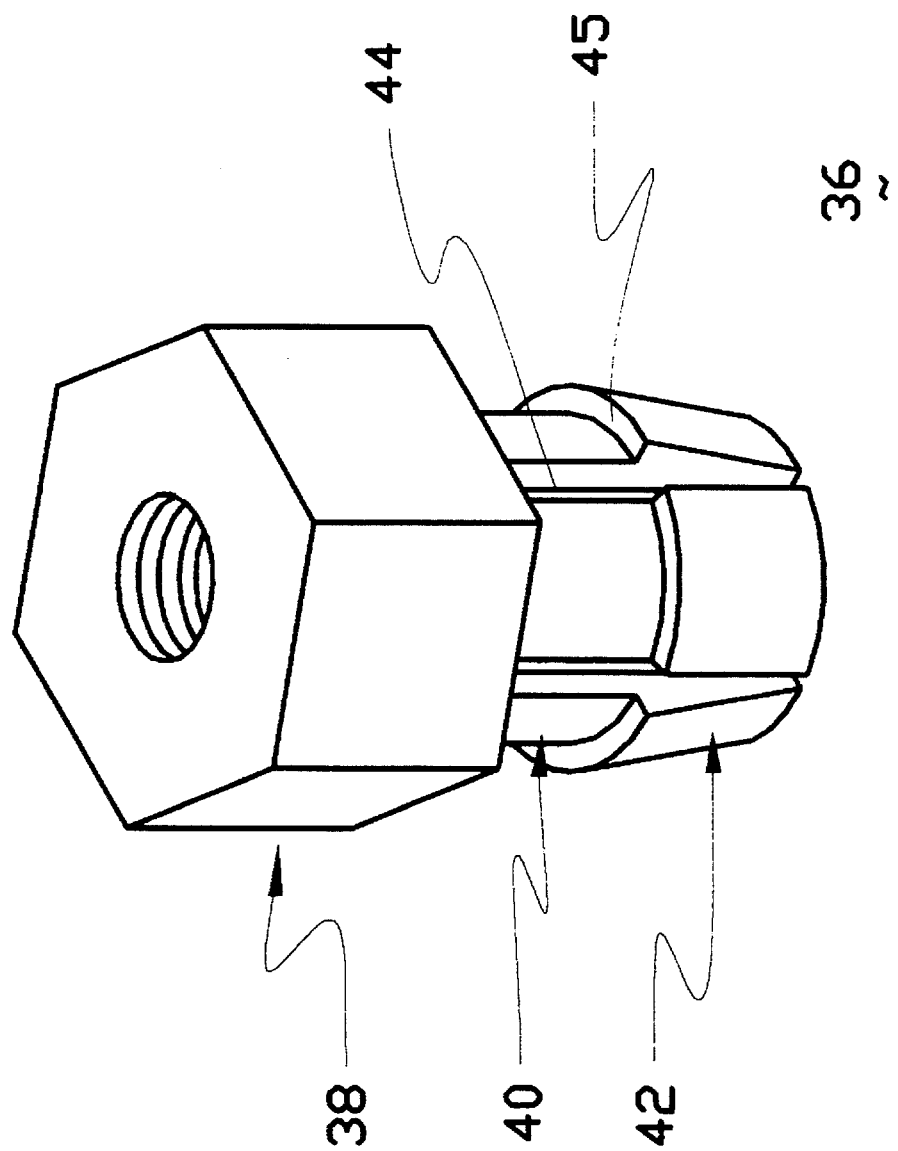
FIG. 5 is an enlarged perspective view of the screw mounting kit of FIG. 4.

A pair of screw mounting kits 36 are adapted to be inserted into such pair of kit receiving holes 34, respectively. Referring to FIG. 5, each screw mounting kit 36 is composed of a internally threaded head portion 38 at the top, a tubular portion 40 in the middle, and a tubular conical portion 42 at the bottom wherein a plurality of slots 44 in equal intervals extend axially along and through the tubular portion 40 and the conical portion 42. A ring-like shoulder 45 is formed on the conical portion 42 adjacent the tubular portion 40.

Figure 6:
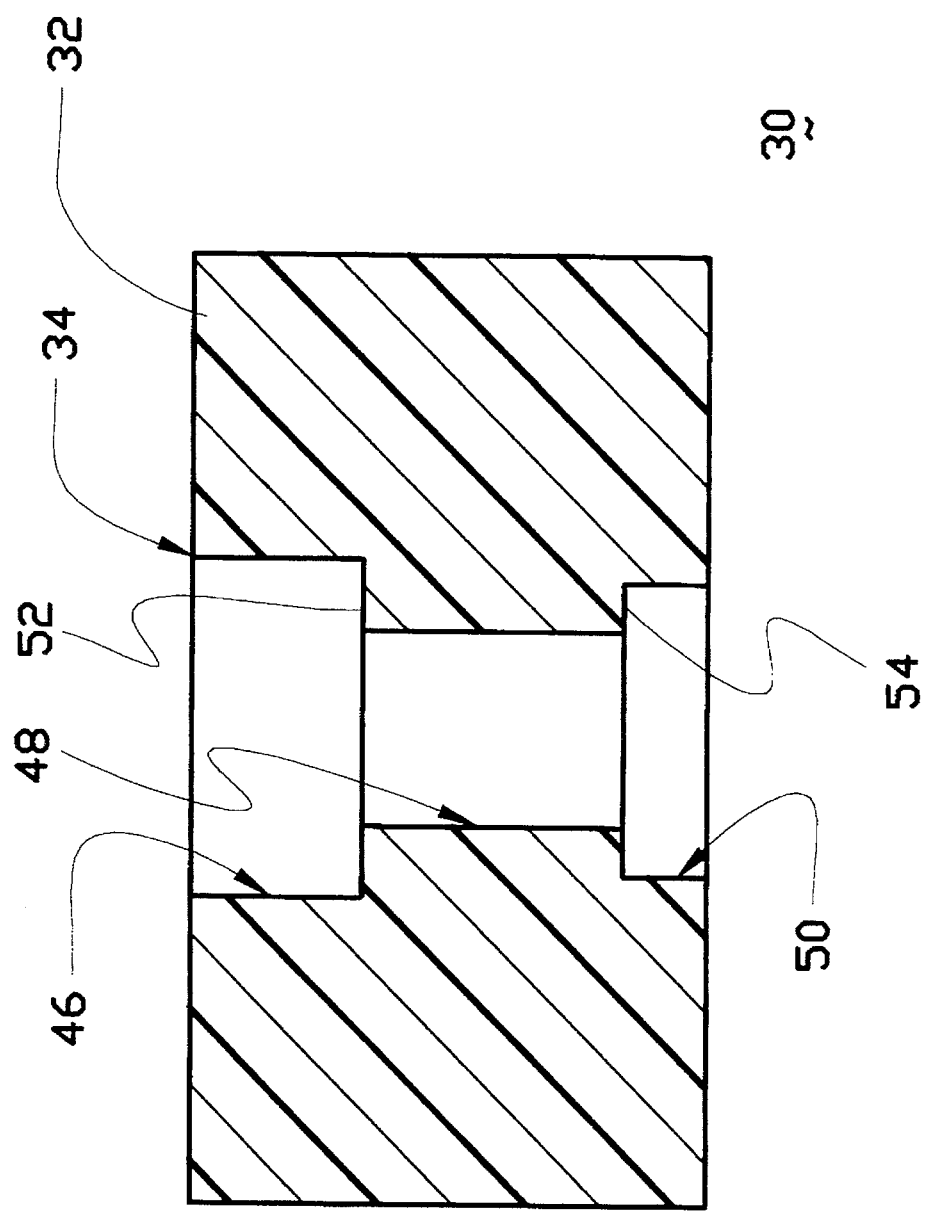
FIG. 6 is an enlarged partial cross-sectional view of the housing to show the internal structure in the kit receiving hole in the connector of FIG. 4.

Referring to FIG. 6, correspondingly, the kit receiving hole 34 in the header device 30 includes a large section 46 at the top, a narrow section 48 in the middle, and a medium section 50 at the bottom, whereby an upper ring-like step 52 is formed at the top of the narrow section 48 adjacent the large section 46, and a lower ring-like step 54 is formed at the bottom of the narrow section 48 adjacent the medium section 50.

Figure 7:
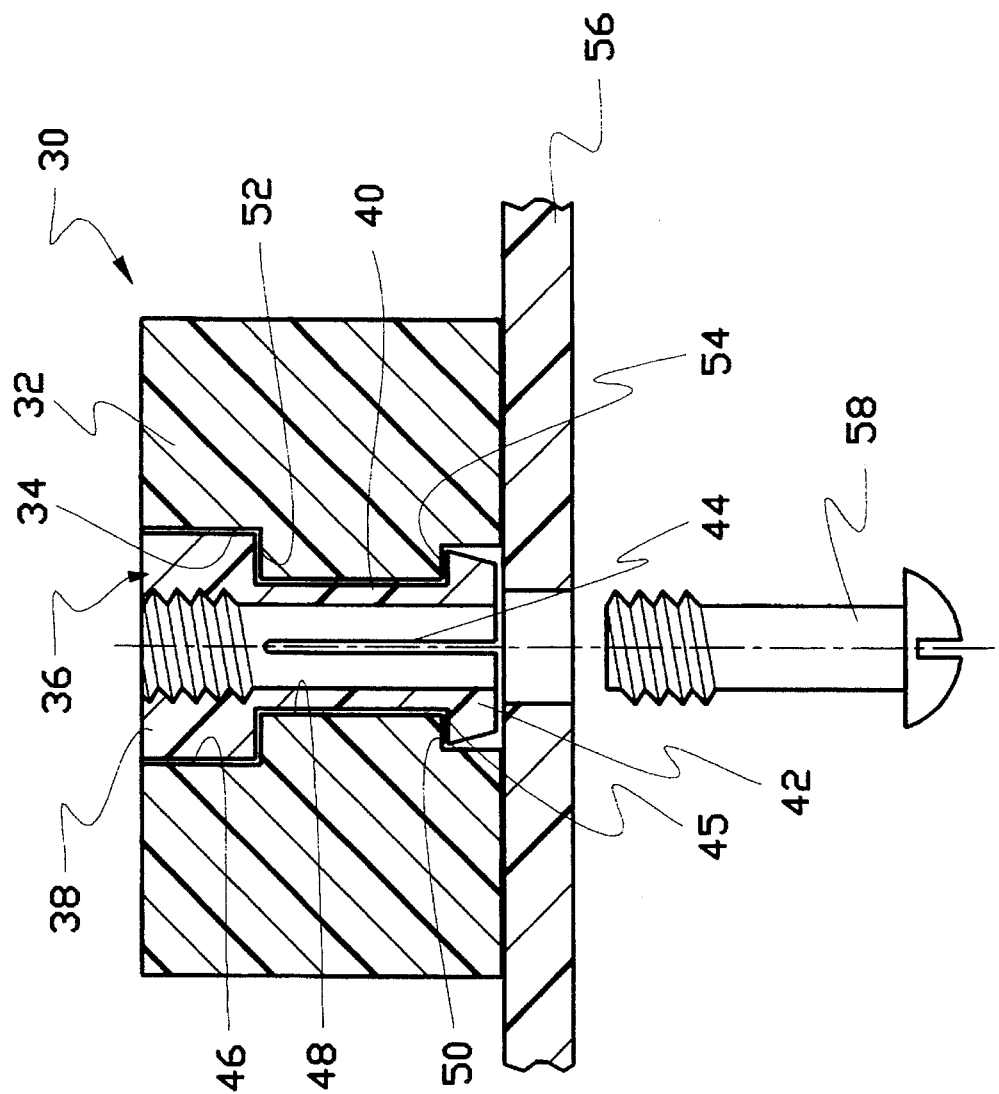
FIG. 7 is a partial cross-sectional view of the connector of FIG. 4 mounted on the board with a screw adapted to be fastened thereto.

When assembled as shown in FIG. 7, each screw mounting kit 36 is inserted into the corresponding kit receiving hole 34 from the top. Via resiliency of the conical portion 42 and the tubular portion 40 provided by the slots 44, the conical portion 42 and the tubular portion 40 may be shrunk inward a little bit for allowing the shoulder 45 of the conical portion 44 to pass the narrow section 48 of the hole 34 until the conical portion 42 of the kit 36 enters the medium section 50 of the hole 34. Thus, the conical portion 42 is sprung outward to have the shoulder 45 engages the lower step 54 in the hole 34. Under this situation, the head portion 38, the tubular portion 40 and the conical portion 42 of the screw kit 36 are appropriately retainably positioned within the large section 46, the narrow section 48 and the medium section 50 in the hole 34, respectively, through the head portion 38 and the shoulder 45 of the kit 36 respectively engaging the upper step 52 and the lower step 54 in the hole 34 without vertical and horizontal movements.

FIG. 7 also shows an application status of the header device 30 mounted on the PC board 56 through a screw 58 upward extending from the bottom.

Figure 8:
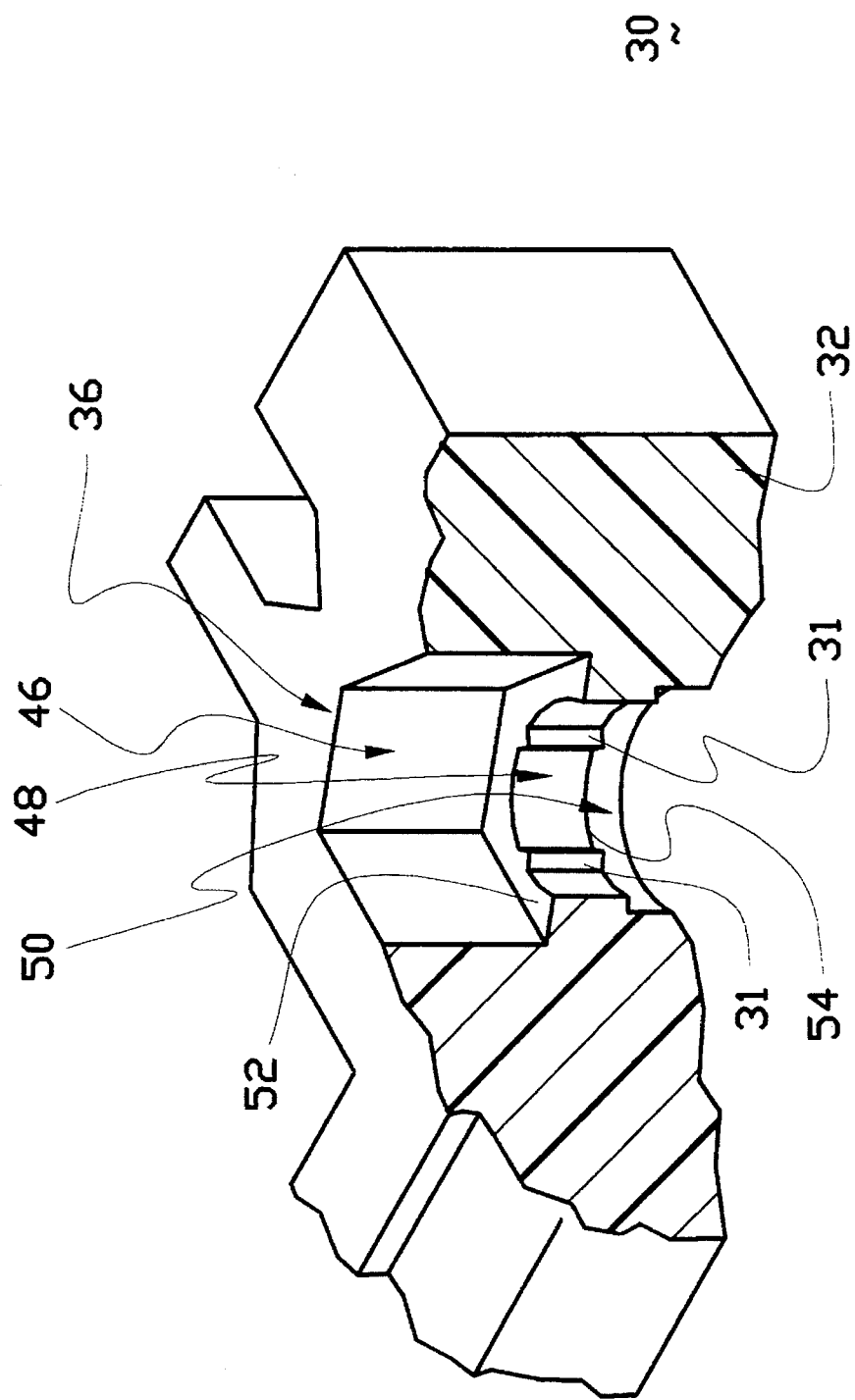
FIG. 8 is an enlarged fragmentary cut-away perspective view of the housing of a connector of another embodiment.

FIG. 8 shows another embodiment of the header device 30 wherein a plurality of ribs 31 are provided along the internal surface of the narrow section 48 in the hole 34 for centering the inserted kit 36 in the hole 34, and also for being able to lower the insertion force due to the less friction force. This results from the kit 36 engaging the ribs 32 instead of the whole internal surface of the narrow section 48 of the hole 34.

It can be understood that in the invention, the screw mounting kit can be in a pre-load state because of resiliency provided therewith to enhance the engagement between the screw mounting kit and the hole of the housing. This pre-loaded engagement between the kit and the hole may efficiently overcome the possible disengagement therebetween due to the shrinkage difference of the metal kit and the plastic housing during cooling process after soldering.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. An electrical connector comprising:

an insulative housing having at least one kit receiving hole for receiving a screw mounting kit therein;

said screw mounting kit including a head portion, a tubular portion and a tubular conical portion wherein a plurality of slots extend axially along the tubular portion and the tubular conical portion; and said kit receiving hole including a large section, a narrow section and medium section for respectively compliantly receiving the corresponding head portion, tubular portion and tubular conical portion of the screw mounting kit so that the screw mounting kit can be fully embedded within the corresponding kit receiving hole wherein an upper step is formed on a top portion of the narrow section adjacent the large section, and a lower step is formed on a bottom portion of the narrow section adjacent the medium section.

2. The electrical connector as defined in claim 1, wherein said conical portion of the kit further includes a shoulder to engage the lower step in the hole.

3. The electrical connector as defined in claim 1, wherein a plurality of ribs are formed on the narrow section of the hole.

4. The electrical connector as defined in claim 1, wherein said head portion has internal threads therein.

5. The electrical connector mounted on the board by at least a screw, comprising:

an insulative housing having at least one screw mounting kit incorporating said screw for fastening said connector to said board whereby external threads of the screw can be engaged with internal threads of the screw nut and a head of said screw abuts against the board on which the connector is seated;

said screw mounting kit including a head portion, a tubular portion and a tubular conical portion; and the housing further including a kit receiving hole for receiving said screw mounting kit therein, said kit receiving hole including a large section, a narrow section and a medium section for respectively receiving the head portion, the tubular portion and the tubular conical portion therein, respectively, wherein a plurality of ribs are formed on the narrow section of the hole.

* * * * *